(12) United States Patent
Takigawa et al.

(10) Patent No.: US 6,693,046 B2
(45) Date of Patent: Feb. 17, 2004

(54) METHOD OF MANUFACTURING SEMICONDUCTOR DEVICE HAVING MULTILEVEL WIRING

(75) Inventors: Yukio Takigawa, Kawasaki (JP); Shun-ichi Fukuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/410,247

(22) Filed: Apr. 10, 2003

(65) Prior Publication Data

US 2004/0002208 A1 Jan. 1, 2004

(30) Foreign Application Priority Data

Jun. 27, 2002 (JP) ........................ 2002-187802
Nov. 21, 2002 (JP) ........................ 2002-338294

(51) Int. Cl.[7] .............................................. H01L 21/31
(52) U.S. Cl. .................... 438/761; 438/763; 438/778; 438/931
(58) Field of Search .......................... 438/761, 762, 438/763, 778, 931, 974

(56) References Cited

U.S. PATENT DOCUMENTS

| | | | | |
|---|---|---|---|---|
| 5,985,412 A | * | 11/1999 | Gosele | ........................ 438/974 |
| 6,025,894 A | * | 2/2000 | Shirasaki et al. | .............. 349/69 |
| 6,080,030 A | * | 6/2000 | Isaka et al. | .......... 257/E51.018 |
| 6,132,811 A | * | 10/2000 | Schellenberger et al. | ... 438/906 |
| 6,459,199 B1 | * | 10/2002 | Kido et al. | .................... 438/35 |
| 6,476,988 B1 | * | 11/2002 | Yudasaka | ............. 257/E27.119 |

FOREIGN PATENT DOCUMENTS

| | | |
|---|---|---|
| JP | 2001-345317 | 12/2001 |
| JP | 2002-315900 | 10/2002 |

* cited by examiner

*Primary Examiner*—Kevin M. Picardat
(74) *Attorney, Agent, or Firm*—Westerman, Hattori, Daniels & Adrian, LLP

(57) ABSTRACT

A method of manufacturing a semiconductor device includes the steps of: (X) forming a first hydrophobic insulating layer above a semiconductor substrate; (Y) hydrophilizing a surface of the first hydrophobic insulating layer; and (Z) forming a low dielectric constant insulating layer having a specific dielectric constant lower than the specific dielectric constant of silicon oxide on the first hydrophobic insulating layer having a bydrophilized surface. A semiconductor device manufacturing method which can suppress peel-off of a low dielectric constant insulating layer from an underlying hydrophobic layer is provided.

20 Claims, 5 Drawing Sheets

METHOD OF MANUFACTURING SEMICONDUCTOR DEVICE HAVING MULTILEVEL WIRING

CROSS REFERENCE TO RELATED APPLICATION

This application is based on Japanese Patent Applications No. 2002-338294, filed on Nov. 21, 2002, and No. 2002-187802, filed on Jun. 27, 2002, the entire contents of which are incorporated herein by reference.

BACKGROUND OF THE INVENTION

A) Field of the Invention

The present invention relates to a semiconductor device manufacturing method, and more particularly to a method of manufacturing a semiconductor device having multilevel wiring layers.

B) Description of the Related Art

The integration degree and operation speed of large scale integrated circuits have been improved increasingly. As the integration degree is improved, semiconductor elements such as transistors constituting an, integrated circuit are becoming smaller and the operation speed of smaller semiconductor elements is also improved.

As the micro patterning and integration degree of semiconductor elements are improved, wiring in a large scale integrated circuit becomes fine and multileveled. A transmission speed of a signal in a wiring line is determined almost by a wiring resistance and a wiring parasitic capacitance.

Reduction in a wiring resistance can be realized by changing the main component of a wiring from aluminum (Al) to copper (Cu) having a lower resistivity. Making the resistance of wiring material lower than that of Cu is practically difficult. As Cu is used as the material of a wiring, it becomes necessary to prevent diffusion of Cu in the wiring into an interlayer insulating film. SiN, SiC or SiCO is mainly used as the material of a copper diffusion preventive layer. The copper diffusion preventive layer has generally a high water repellency.

If the distance between wiring lines becomes short because of high integration of semiconductor devices, the parasitic capacitance between wiring lines increases assuming that the wiring thickness is the same. If the parasitic capacitance is lowered by thinning the wiring thickness, the wiring resistance increases. In order to lower the wiring capacitance, it is most effective to use material having a low dielectric constant, so-called low k material.

In this specification, the value of dielectric constant will be referred to by the specific dielectric constant.

There are many reports on a method of forming an interlayer insulating film by using material having a dielectric constant lower than that of silicon oxide in order to realize a high speed operation of a semiconductor device. Since a wiring capacitance becomes serious particularly for lower level micro patterned wiring layers, it has been studied to form an interlayer insulating film by using a low dielectric constant material.

If a low dielectric constant insulating material layer is formed in a liquid phase on a copper diffusion preventive layer having a hydrophobic surface, adhesion is likely to be lowered. If a low dielectric constant insulating material layer is formed on a copper diffusion preventive layer, by a coating method in particular, adhesion is likely to be lowered. In the multilevel wiring structure, peel-off at the interface between a low dielectric constant insulating layer and a hydrophobic underlying layer may occur. As the number of wiring layers increases, peel-off of a low dielectric constant insulating layer becomes more conspicuous.

SUMMARY OF THE INVENTION

An object of this invention is to provide a method of manufacturing a semiconductor device capable of suppressing peel-off of a low dielectric constant insulating layer from a hydrophobic underlying layer.

Another object of the invention is to provide a method of manufacturing a semiconductor device of a high performance, a high reliability and a high integration.

According to one aspect of the present invention, there is provided a method of manufacturing a semiconductor device comprising the steps of: (X) forming a first hydrophobic insulating layer above a semiconductor substrate; (Y) hydrophilizing a surface of said first hydrophobic insulating layer; and (Z) forming a low dielectric constant insulating layer having a specific dielectric constant lower than a specific dielectric constant of silicon oxide on said first hydrophobic insulating layer having a hydrophilized surface.

With this method, adhesion of a multilevel wiring structure can be improved and peel-off can be suppressed.

DESCRIPTION OF THE PREFERRED EMBODIMENTS

An embodiment of the invention will be described with reference to the accompanying drawing.

Figure 1A:
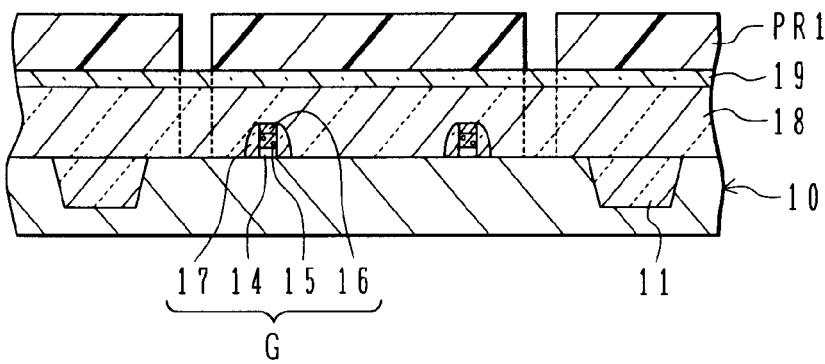
FIGS. 1A to 1L are cross sectional views of a semiconductor substrate illustrating a method of manufacturing a semiconductor device according to an embodiment of the invention.

As shown in FIG. 1A, an element isolation trench or trenches are formed in the surface layer of a silicon substrate 10 and insulating material such as silicon oxide is filled in this trench to form a shallow trench isolation (STI) 11. If necessary, before or after STI is formed, ions are implanted to form a desired well or wells in the surface layer of the silicon substrate 10. A number of active regions are defined being surrounded by STI 11.

On the surface of each active region of the silicon substrate 10, an insulated gate electrode is formed which is made of a lamination of a gate insulating film 14, a polysilicon gate electrode 15 and a silicide electrode 16. Side wall spacers 17 are formed on both side walls of the insulated gate electrode. The insulated gate electrode structure is collectively represented by G. Before and after the side wall spacers 17 are formed, desired ions are implanted to form source/drain regions with extensions. A CMOS transistor structure can be formed by forming n- and p-channel transistors.

After semiconductor elements such as MOS transistors are formed, a phosphosilicate glass (PSG) layer 18 is deposited to a thickness of about 1.5 $\mu$m by chemical vapor deposition (CVD) at a substrate temperature of 600° C. for example. The deposited PSG layer 18 has an irregular surface which conforms with the surface of the underlying structure including the gate electrode and the like. The surface of the PSG layer 18 is planarized by chemical mechanical polishing (CMP). On the planarized surface, an SiC film 19 is formed as a passivation film. For example, the SiC film 19 is formed by plasma CVD to a thickness of about 50 nm by using the material ESL3 (registered trademark) available from Novellus Systems. The SiC layer 19 has also a copper diffusion preventing function of preventing Cu in a copper wiring formed on the SiC layer 19 from being diffused downward.

On the surface of the SiC layer 19, a resist pattern PR1 is formed. The resist pattern PR1 has an opening to be used for forming a contact hole in an electrode deriving area of a semiconductor element. By using the resist pattern PR1 as an etching mask, the SiC layer 19 and PSG layer 18 are etched to form a contact hole.

Figure 1B:
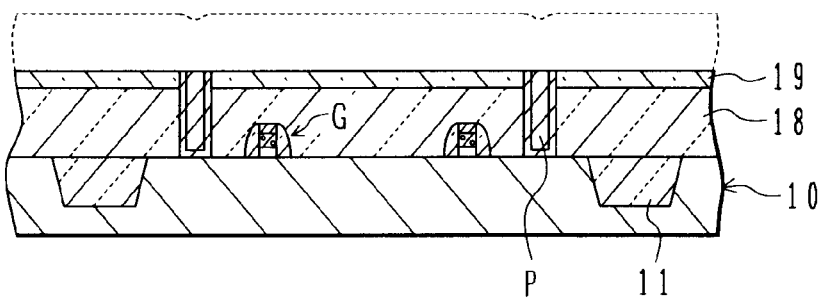

As shown in FIG. 1B, a barrier metal layer of TiN, Ta or the like is deposited covering the inner wall of the contact hole by sputtering, and thereafter a tungsten (W) layer is formed by CVD. Unnecessary metal layers deposited on the SiC film 19 are removed by CMP. In this manner, a conductive (contact) plug P is formed which is embedded in the contact hole and has a surface flush with the surface of the SiC film 19.

Figure 1C:
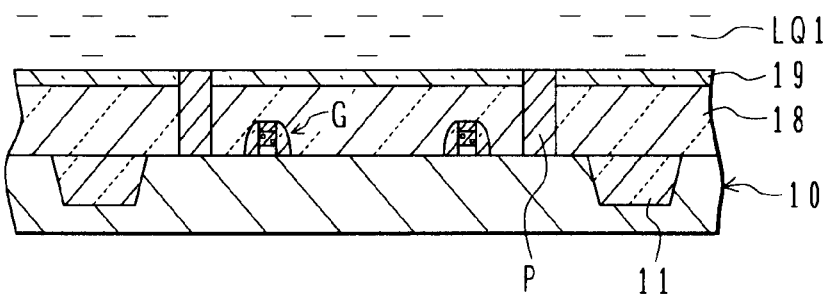

As shown in FIG. 1C, surface treatment is performed by dispensing drops of alkaline ammonium fluoride ($NH_4F$) 5% aqueous solution LQ1 on the surface of the insulating film constituted of the PSG layer 18 and SiC layer 19 and embedded with the W conductive plug P, and maintaining the solution in contact with the surface of the insulating film for about 2 minutes at a room temperature. After the surface treatment, the surface of the semiconductor substrate is washed with pure water and dried with a spinner. With this surface treatment, the surface of the SiC layer 19 becomes hydrophilic.

Figure 1D:
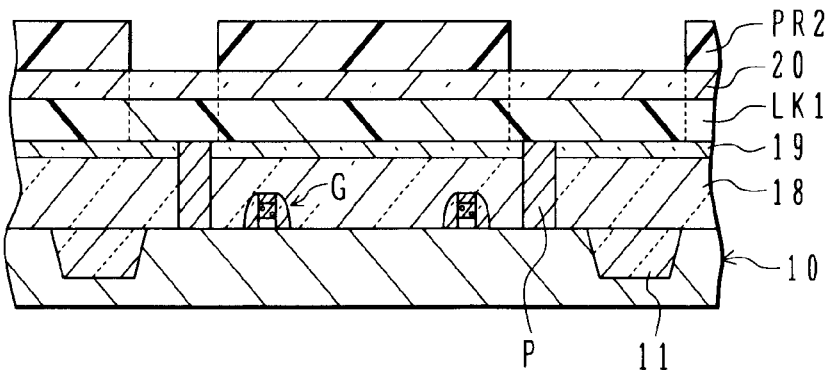

As shown in FIG. 1D, on the surface of the SiC film 19, a low dielectric constant layer LK1, which is a so-called low k material, is coated to a thickness of about 150 nm. For example, the low dielectric constant insulating layer LK1 is coated by using the material SiLK-J150 (registered trademark) available from Dow Chemical Company. After the low dielectric constant film LK1 is coated, it is baked to evaporate solvent and a curing process is performed, by heat treatment. On the surface of the low dielectric constant insulating film LK1, a cap layer 20 of silicon oxide (SiO) or the like is deposited to a thickness of about 100 nm by CVD for example.

On the surface of the cap layer 20, a resist pattern PR2 is formed. The resist pattern PR2 has an opening corresponding to a wiring pattern of a first wiring layer. By using the resist pattern PR2 as an etching mask, the cap layer 20 and low dielectric constant insulating film LK1 are etched to form a wiring trench. The resist pattern PR2 is thereafter removed.

Figure 1E:
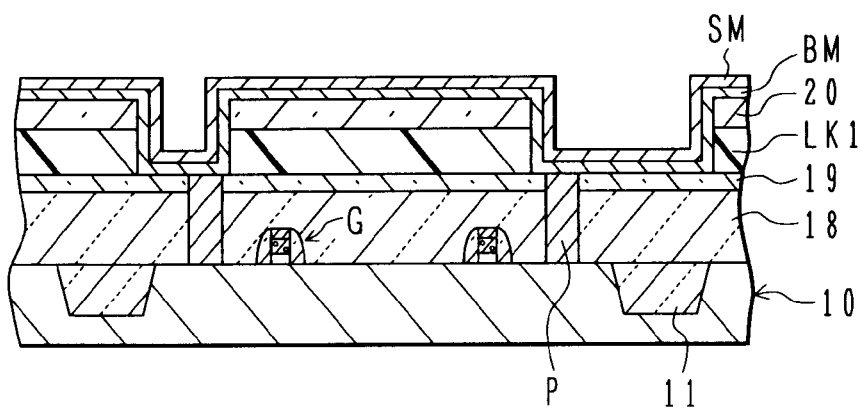

As shown in FIG. 1E, on the inner surface of the wiring trench exposing the top of the conductive plug P and on the surface of the substrate, a barrier metal layer BM of TaN or the like is formed to a thickness of about 30 nm and a seed metal layer SM of Cu is formed to a thickness of about 30 nm, by sputtering.

Figure 1F:
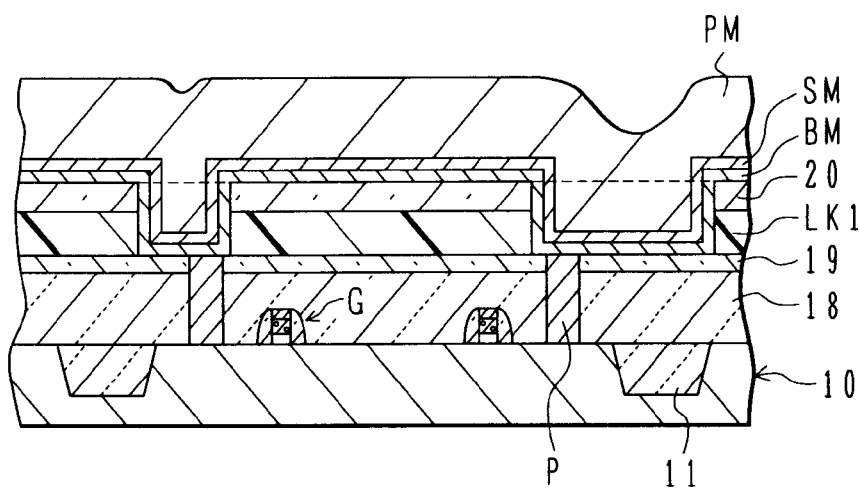

As shown in FIG. 1F, on the surface of the seed metal layer SM, a copper wiring layer PM is formed by plating. Thereafter, CMP is performed to remove unnecessary metal layers on the surface of the cap layer 20.

Figure 1G:
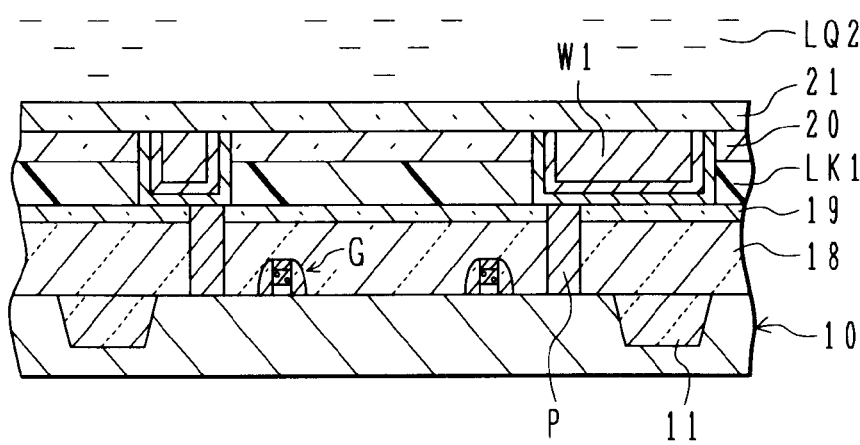

As shown in FIG. 1G, on the surface of the cap layer 20 embedded with a first wiring pattern W1, a copper diffusion preventive layer 21 is formed by plasma CVD similar to that described earlier. For example, the copper diffusion preventive layer 21 is made of an SiC layer having a thickness of 50 nm. After the copper diffusion preventive layer 21 is formed, surface treatment is performed by dispensing drops of alkaline ammonium fluoride 5% aqueous solution LQ2 on the surface of the copper diffusion preventive layer 21, and maintaining the solution in contact with the surface of the copper diffusion preventive layer for about 2 minutes at a room temperature. After the surface treatment, the surface of the semiconductor substrate is washed with pure water and dried with a spinner. With this surface treatment, the surface of the SiC layer 21 becomes hydrophilic.

Figure 1H:
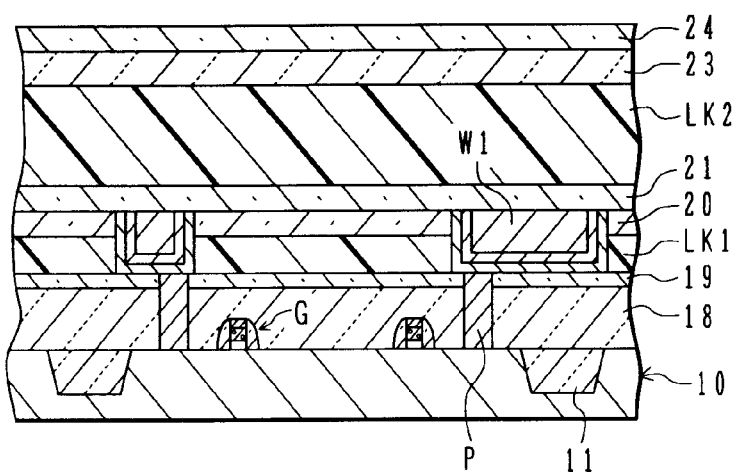

As shown in FIG. 1H, on the surface of the SiC layer 21 subjected to the surface treatment, a low dielectric constant insulating layer LK2 is coated to a thickness of about 400 nm. For example, the low dielectric constant insulating layer LK2 is coated by using the material SiLK-J350 (registered trademark) available from Dow Chemical Company. After the liquid material is coated, a baking and curing process is performed to form the low dielectric constant insulating layer LK2. On the surface of the low dielectric constant insulating film LK2, a cap layer 23 of SiO or the like is deposited to a thickness of, e.g., about 100 nm and a hard mask layer 24 made of silicon nitride (SiN) is formed to a thickness of e.g., about 50 nm by CVD.

Figure 1I:
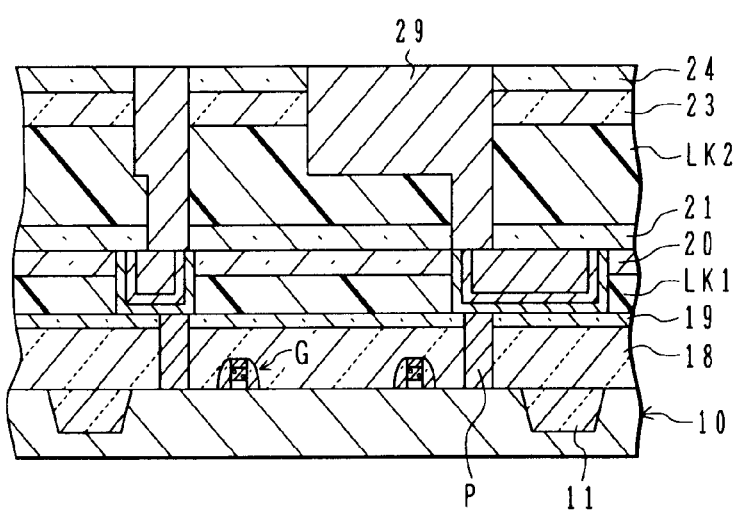

As shown in FIG. 1I, a dual damascene wiring pattern 29 is embedded in the hard mask layer 24, cap layer 23, low dielectric constant insulating film LK2 and copper diffusion preventive layer 21. For example, an opening defining a wiring trench is formed in the hard mask 24 by using a resist pattern, and thereafter a via hole reaching the copper diffusion preventive layer 21 is formed by using a resist pattern. By using the hard mask layer 24 as an etching mask, a wiring trench is formed by etching the cap layer 23 and low dielectric constant insulating film LK2. Then, the copper diffusion preventive layer 21 exposed on the bottom of the via hole is etched to complete a dual damascene wiring trench.

Next, similar to the process described with reference to FIG. 1F, a barrier metal layer, a seed metal layer and a plated layer are laminated, and unnecessary portion of the metal layers on the hard mask layer 24 is removed by CMP to complete the second wiring pattern 29. The hard mask layer 24 may be removed by CMP.

Figure 1J:
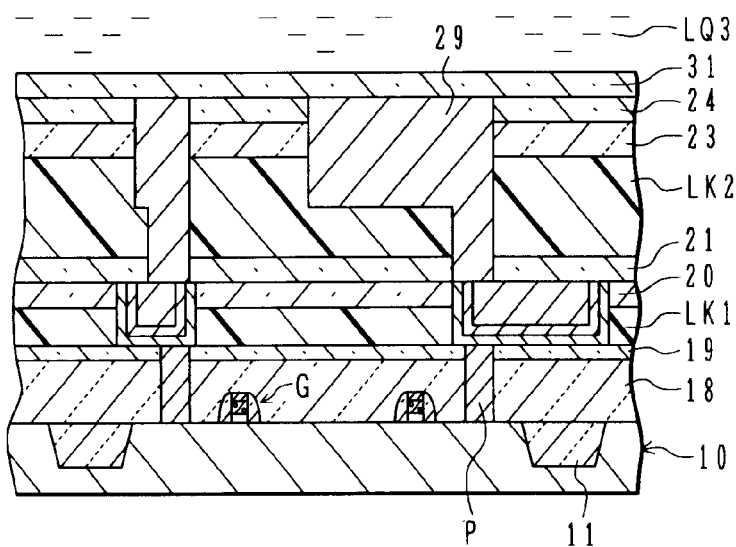

As shown in FIG. 1J, above the surface of the second interlayer insulating layer LK2 embedded with the second wiring layer 29, a copper diffusion preventive layer 31 of SiC having a thickness of, e.g., 50 nm is formed by plasma CVD. Surface treatment is performed by dispensing drops of alkaline ammonium fluoride 5% aqueous solution LQ2 on the surface of the SiC layer 31, and maintaining the solution in contact with the surface of the SiC layer 31 for about 2 minutes at a room temperature. The surface of the hydrophobic SiC layer 31 becomes hydrophilic.

Figure 1K:
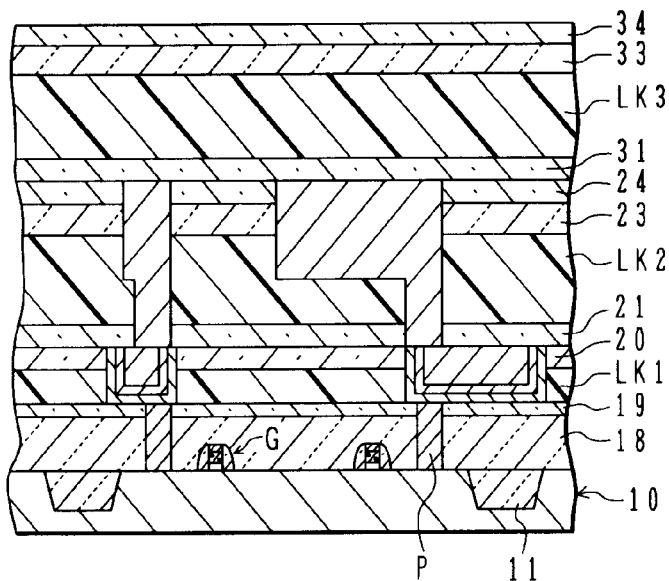

As shown in FIG. 1K, on the SiC layer 31 subjected to the surface treatment, a low dielectric constant insulating layer LK3 of the material SiLK-J350 (trademark) is coated to a thickness of about 450 nm by a process similar to that described earlier. On the surface of the low dielectric constant layer LK3, a cap layer 33 of SiO having a thickness of about 100 nm and a hard mask layer 34 of SiN having a thickness of about 50 nm are formed. A third wiring pattern is formed through the hard mask layer 34, cap layer 33, low dielectric constant insulating layer LK3 and copper diffusion preventive layer 31 by a process similar to that described earlier.

Similar processes are repeated to form the wiring structure having, e.g., five wiring layers.

Figure 1L:
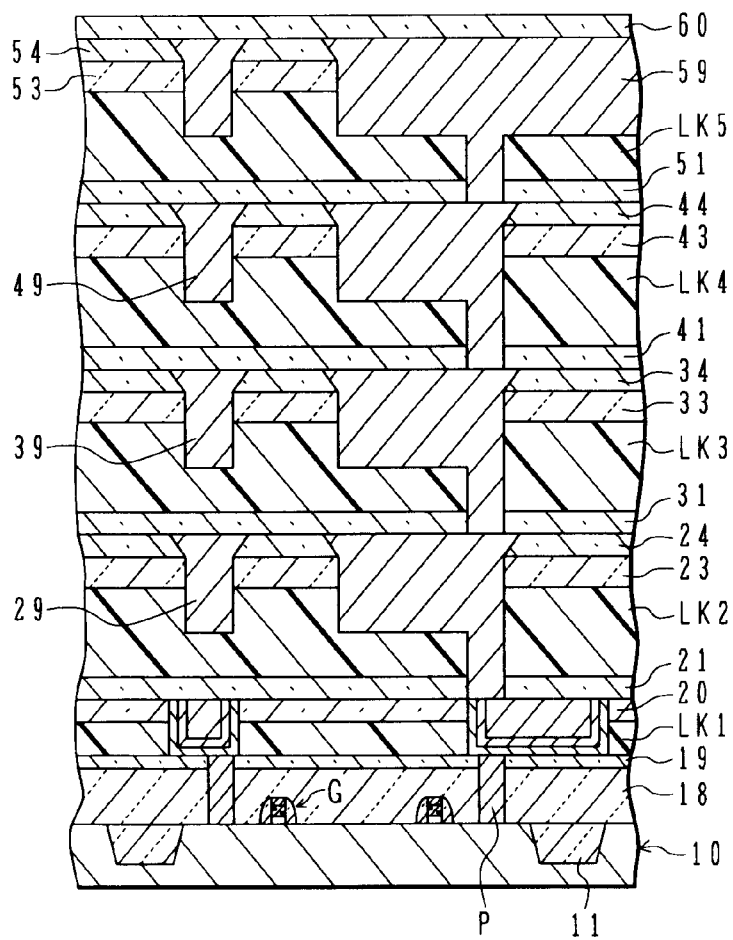

FIG. 1L shows an example of the structure of five wiring layers. The third wiring pattern 39 is embedded in the third interlayer insulating film. On the surface of this structure, a copper diffusion preventive layer 41, a low dielectric constant insulating layer LK4, a cap layer 43 and a hard mask layer 44 are stacked, and a fourth wiring pattern 49 is embedded in this structure. On the surface of this structure including the fourth wiring pattern, a copper diffusion preventive layer 51, a low dielectric constant insulating layer LK5, a cap layer 53 and a hard mask layer 54 are stacked, and a fifth wiring pattern 59 is embedded in this structure. Covering this structure including the fifth wiring pattern 59, a cap layer 60 of SiC or the like is formed. An $SiO_2$ film as an interlayer insulating film and an aluminum pad are formed thereon.

A capacitance of the second wiring pattern in the multilevel wiring structure constructed as above, was measured. A sample of the wiring pattern used was a comb-shaped wiring pattern having a pitch of 0.24 μm and a total length of 30 cm. The measured capacitance was about 180 fF/mm. After heat treatment for 30 minutes at 400° C. was repeated five times, film peel-off was not found at all.

A similar heat cycle test was performed for a semiconductor device having a multilevel wiring structure formed without the surface treatment of an SiC layer. Peel-off occurred at the interface between a SiC copper diffusion preventive layer and a SiLK low dielectric constant insulating layer thereon. These results elucidate the effects of the surface treatment of a copper diffusion preventive layer.

How a water contact angle of an SiC layer changes with the surface treatment was measured. The water contact angle of an SiC layer before the surface treatment was 48 degrees, whereas the water contact angle of an SiC layer after the surface treatment by ammonium fluoride 5% aqueous solution for 2 minutes at a room temperature was 33 degrees.

In the embodiment, ammonium fluoride 5% aqueous solution was used as hydrophilic process liquid. The hydrophilic process liquid is not limited only to this. Instead of ammonium fluoride, ammonium primary phosphate 30% aqueous solution was used as the hydrophilic process liquid. This surface process is performed for 2 minutes at a room temperature similar to the above-described embodiment. After heat treatment for 30 minutes at 400° C. was repeated five times, film peel-off was not found at all.

A change in a water contact angle of an SiC layer was measured. The water contact angle of an SiC layer before the surface treatment was 48 degrees as described above. The water contact angle of an SiC layer after the surface treatment by ammonium primary phosphate 30% aqueous solution for 2 minutes at a room temperature was 36 degrees. It is apparent that the SiC becomes hydrophilic by the surface treatment.

These results may be ascribed to the followings.

Figure 2A:
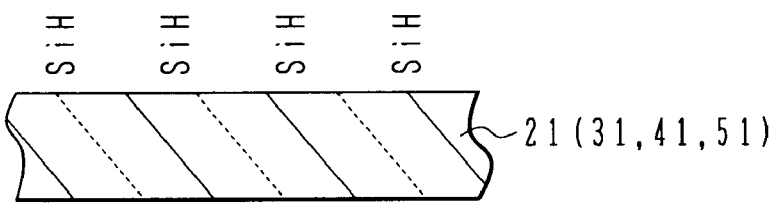
FIGS. 2A to 2C are diagrams illustrating the effects of the embodiment.

As shown in FIG. 2A, it can be considered that the surface of the SiC layer 21 (31, 41, 51) is terminated by SiH. The surface of the SiC layer is therefore hydrophobic. Adhesion lowers because wettability of a low dielectric constant insulating layer to be formed on the surface of the SiC layer 21 is degraded.

Figure 2B:
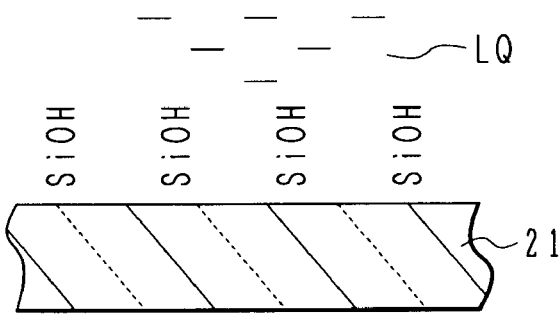

As shown in FIG. 2B, as the surface of the SiC layer 21 is processed by alkaline solution which contains water, the SiH group is changed to an SiOH group. The surface of the SiC layer with H being replaced with OH becomes hydrophilic.

Figure 2C:
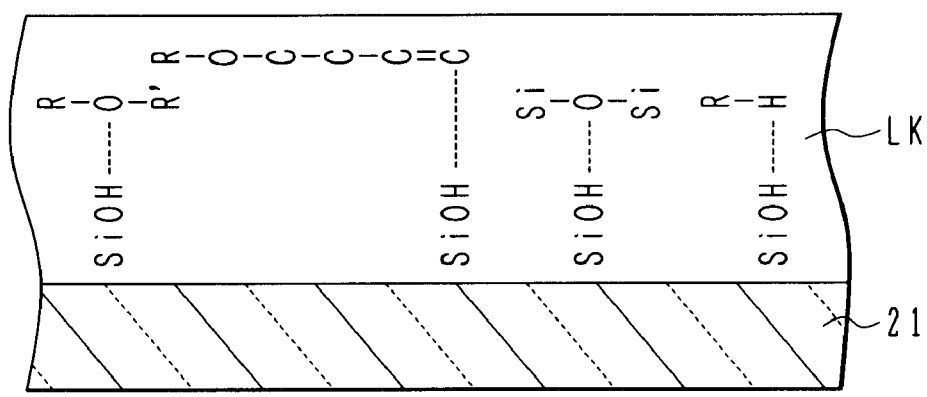

As shown in FIG. 2C, as an organic low dielectric constant insulating layer is formed on the SiC layer 21 subjected to the surface treatment, hydrogen bond or dehydration and condensation occur between the OH group and C of aryl ether R—O—C—C=C, O of siloxane bond Si—O—Si, O of phenyl ether R—O—R', hydrogen of R—H, and the like. The low dielectric constant insulating layer LK and SiC layer 21 are therefore formed with good adhesion.

Alkaline aqueous solution may be aqueous solution of the mixture of pure water and ammonium phosphate, ammonium fluoride, ammonium sulfate, 1,4-naphthhydroquinone-2-ammonium sulfonate, ammonium nitrate, ammonium acetate, ammonium calcium nitrate, ammonium iron citrate or the like. Changing the SiH group on the surface to the SiOH group is not limited only to using ammonium aqueous solution, but using alkaline solution having the OH group may be effective. If the surface of the SiC layer is washed thereafter to completely remove the hydrophilic process liquid, various kinds of alkaline solution may be used. Alkaline solution which contains alkaline metal such as Na may also be used.

Liquid material for forming the low dielectric constant insulating layer may contain adhesion accelerator. The adhesion accelerator may be Si compound having an unsaturated bond such as $(RO)_3SiCH=CH_2$, $(RO)_3SiCCH$, $SiCH_2CH=CH_2$, and $Si—CH_2CCH$. By using these materials, adhesion can be improved. After the adhesion accelerator is coated on the underlying layer, a low dielectric constant insulating layer may be formed.

In this embodiment, although the SiC layer is used as the copper diffusion preventive layer, an SiN layer or an SiOC layer may also be used as the copper diffusion preventive layer, with expected improvement of adhesion. A change in the water contact angle on an SiOC layer subjected to the surface treatment was measured. The water contact angle of the SiOC layer before the surface treatment was 98 degrees. The water contact angle after the surface treatment by ammonium fluoride 5% aqueous solution for 2 minutes at a room temperature was 65 degrees. The water contact angle after the surface treatment by ammonium primary phosphate 30% aqueous solution for 2 minutes at a room temperature was 80 degrees. It is apparent that the copper diffusion preventive layer becomes hydrophilic by the surface treatment.

Hydrophilization improves wettability with L-butyrolactone or the like contained in varnish in low dielectric constant insulating material. Adhesion with the low dielectric constant insulating layer can therefore be improved.

Hydrophilization may be performed by using acidic aqueous solution having an OH group. Acetic acid, oxalic acid, citric acid, oxalo acid, succinic acid, fumaric acid, tartaric acid, formic acid, lactic acid, hydrogen peroxide, ozonized water and nitric acid may be used for acidic aqueous solution. Hydrophilization is performed by directly oxidizing the SiH group in the SiC layer and changing it to SiOH. The water contact angle on the SiC layer subjected to the surface treatment by acetic acid 3% aqueous solution for 2 minutes at a room temperature was 33 degrees.

When chemical solution is used, this may be heated if necessary. Heating can change the SiH group to the OH group in a short time. The temperature is set to 30 to 95° C. or more preferably to 35 to 50° C. If ammonium fluoride aqueous solution is used, both a process for 5 minutes at a room temperature and a process for 2 minutes at 40° C. are equivalent in terms of improvement of adhesion.

Prevention of a film peel-off and improvement of adhesion may be ascribed to changing the hydrophobic surface with the SiH group to the hydrophilic surface. In order to form a hydrophilic surface, an oxide film may be formed on the hydrophobic surface. Instead of the above-described surface treatment using solution, the hydrophobic surface may be exposed in oxygen-containing plasm to form an oxide film on the hydrophobic surface, with expected similar effects. In this case, LQ shown in FIG. 2B is plasma of oxygen-containing oxidizing gas.

Although an organic insulating layer of SiLK (registered trademark) is used as the low dielectric constant insulating layer, an organic insulating layer of FLARE (registered trademark) may also be used with expected similar effects. Porous silica of hydrogensilsesquioxane, methylsilsesquioxane or the like may also be used. An insulating layer made of porous silica coating material having an inorganic methyl group or the like is also hydrophobic. Also in this case, adhesion is expected to be improved by the surface treatment.

Silicon oxycarbide (SiOC) formed by CVD has a specific dielectric constant of, e.g., about 3 lower than that of about 4.1 of silicon oxide. An interlayer insulating film may be formed by CVD using TORAL (c.f. JP-A-2002-315900, which is incorporated here in by reference) or the like. TORAL is formed under the conditions that a flow rate of tetramethylcyclotetrasiloxane (TOMCOTS) as source gas is set to one fifth, an oxygen flow rate is set to one fifth or lower, and the power is set to one second and so on, by changing the manufacture conditions of CORAL (registered trademark) of Novellus Systems, Black Diamond (registered trademark) of Applied Materials (AMAT), Inc. and CORAL (registered trademark) of Novellus Systems.

In a multilevel wiring structure having, e.g., ten or more layers, SiLK, FLARE or the like is used as the material of the fourth and lower level interlayer insulating films, and silicon oxycarbide is used as the material of the fifth to eighth intermediate level interlayer insulating films. Good characteristics of the multilevel wiring structure can be obtained.

Silicon oxycarbide deposited by CVD is likely to become hydrophobic so that adhesion to the (copper diffusion preventive) underlying layer such as an SiC layer is degraded. By hydrophilizing the underlying layer surface and forming a silicon oxycarbide layer thereon, the hydroxyl group on the surface of an SiC or SiN layer reacts with the SiH group or the like of the low dielectric constant insulating layer.

The present invention has been described in connection with the preferred embodiments. The invention is not limited only to the above embodiments. It will be apparent to those skilled in the art that various modifications, improvements, combinations, and the like can be made.

We claim:

1. A method of manufacturing a semiconductor device comprising the steps of:
   (X) forming a first hydrophobic insulating layer above a semiconductor substrate;
   (Y) hydrophilizing a surface of said first hydrophobic insulating layer; and
   (Z) forming a low dielectric constant insulating layer having a specific dielectric constant lower than a specific dielectric constant of silicon oxide on said first hydrophobic insulating layer having a hydrophilized surface.

2. A method of manufacturing a semiconductor device according to claim 1, further comprising before said step (X) the steps of:
   (a) forming a first interlayer insulating film above the semiconductor substrate having a number of semiconductor elements; and
   (b) embedding a first copper wiring in said first interlayer insulating film,
   wherein:
      said step (X) forms the first hydrophobic insulating layer on said first interlayer insulating film embedded with said first copper wiring; and
      said step (Z) forms a second interlayer insulating film on said first hydrophobic insulating layer.

3. A method of manufacturing a semiconductor device according to claim 2, further comprising after said step (Z) the steps of:
   (c) embedding a second copper wiring in said second interlayer insulating film;
   (d) forming a second hydrophobic insulating layer on said second interlayer insulating film embedded with said second copper wiring; and
   (e) processing a surface of said second hydrophobic insulating layer with water-containing alkaline solution to hydrophilize the surface.

4. A method of manufacturing a semiconductor device according to claim 2, wherein said first interlayer insulating layer includes a low dielectric constant insulating layer having a specific dielectric constant lower than a specific dielectric constant of silicon oxide, and said first and second interlayer insulating films each have an oxide cap layer on said low dielectric constant insulating layer.

5. A method of manufacturing a semiconductor device according to claim 1, wherein said first hydrophobic insulating layer is made of silicon carbide, silicon nitride, silicon oxycarbide or a combination thereof.

6. A method of manufacturing a semiconductor device according to claim 1, wherein said step (Y) hydrophilizes the surface of said first hydrophobic insulating layer with alkaline solution or acidic solution which contains an OH group.

7. A method of manufacturing a semiconductor device according to claim 6, wherein said step (Y) processes the surface of said first hydrophobic insulating layer with alkaline solution which contains an OH group, and the alkaline solution is aqueous solution containing at least one selected from a group consisting of ammonium phosphate, ammonium fluoride, ammonium sulfate, 1,4-naphthhydroquinone-2-ammonium sulfonate, ammonium nitrate, ammonium acetate, ammonium calcium nitrate, and ammonium iron citrate.

8. A method of manufacturing a semiconductor device according to claim 6, wherein said step (Y) processes the surface of said first hydrophobic insulating layer with acidic solution which contains an OH group, and the acidic solution is aqueous solution containing at least one selected from a group consisting of acetic acid, oxalic acid, citric acid, oxalo acid, succinic acid, fumaric acid, tartaric acid, formic acid, lactic acid, hydrogen peroxide, ozonized water and nitric acid.

9. A method of manufacturing a semiconductor device according to claim 6, wherein said step (Y) heats the alkaline solution or acidic solution.

10. A method of manufacturing a semiconductor device according to claim 6, wherein, said step (Y) dispenses drops of the alkaline solution or acidic solution on the surface of said first hydrophobic insulating layer.

11. A method of manufacturing a semiconductor device according to claim 1, wherein said step (Y) exposes said first hydrophobic insulating layer in plasma including oxidizing gas.

12. A method of manufacturing a semiconductor device according to claim 1, wherein said step (X) forms said first hydrophobic insulating layer by plasma CVD.

13. A method of manufacturing a semiconductor device according to claim 1, wherein said step (Z) coats liquid phase material which contains adhesion accelerator.

14. A method of manufacturing a semiconductor device according to claim 1, wherein said said step (Z) coats adhesion accelerator and coats liquid phase material of said low dielectric constant insulating layer.

15. A method of manufacturing a semiconductor device according to claim 1, wherein said low dielectric constant insulating layer is a porous silica layer.

16. A method of manufacturing a semiconductor device according to claim 1, wherein said step (Z) forms said low dielectric constant insulating layer by CVD.

17. A method of manufacturing a semiconductor device according to claim 16, wherein said low dielectric constant insulating layer is a silicon oxycarbide layer.

18. A method of manufacturing a semiconductor device according to claim 1, wherein said low dielectric constant insulating layer is an organic material layer.

19. A method of manufacturing a semiconductor device according to claim 2, wherein said step (b) forms said first copper wiring by damascene process.

20. A method of manufacturing a semiconductor device according to claim 3, wherein said step (c) forms said second copper wiring by damascene process.

* * * * *